(12) United States Patent
Maziasz

(10) Patent No.: US 8,762,898 B1
(45) Date of Patent: Jun. 24, 2014

(54) DOUBLE PATTERNING AWARE ROUTING WITHOUT STITCHING

(71) Applicant: Robert L. Maziasz, Austin, TX (US)

(72) Inventor: Robert L. Maziasz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/861,509

(22) Filed: Apr. 12, 2013

(51) Int. Cl.
*G06F 17/50* (2006.01)

(52) U.S. Cl.
USPC .............................................. 716/51; 716/50

(58) Field of Classification Search
CPC ............ G06F 17/5077; G06F 17/5081; H01L 21/76895; H01L 21/823475; H01L 21/823871
USPC ...................................................... 716/50, 51
See application file for complete search history.

(56) References Cited

U.S. PATENT DOCUMENTS

| | | | | |
|---|---|---|---|---|
| 4,295,149 A * | 10/1981 | Balyoz et al. | .................. | 257/211 |
| 5,364,452 A * | 11/1994 | Cupertino et al. | ............... | 75/710 |
| 5,595,843 A * | 1/1997 | Dao | ................... | 430/5 |
| 5,987,086 A * | 11/1999 | Raman et al. | ................... | 716/120 |
| 6,197,456 B1 * | 3/2001 | Aleshin et al. | ................... | 430/5 |
| 6,525,350 B1 * | 2/2003 | Kinoshita et al. | .............. | 257/202 |
| 6,825,098 B2 * | 11/2004 | Gabric et al. | ................. | 438/456 |
| 7,023,063 B2 * | 4/2006 | Gabric et al. | ................. | 257/396 |
| 7,117,468 B1 * | 10/2006 | Teig et al. | ...................... | 716/129 |
| 7,188,322 B2 * | 3/2007 | Cohn et al. | ....................... | 716/53 |
| 7,197,738 B1 * | 3/2007 | Hetzel et al. | .................... | 716/126 |
| 7,503,029 B2 * | 3/2009 | Sinha et al. | ....................... | 716/51 |
| 7,669,170 B2 * | 2/2010 | Cohn et al. | ....................... | 716/54 |
| 8,209,639 B2 * | 6/2012 | Sinha et al. | ....................... | 716/51 |
| 8,219,941 B2 * | 7/2012 | Sinha et al. | ....................... | 716/51 |
| 8,560,998 B1 * | 10/2013 | Salowe et al. | .................. | 716/126 |
| 2006/0036977 A1 * | 2/2006 | Cohn et al. | ......................... | 716/4 |
| 2011/0014786 A1 | 1/2011 | Sezginer et al. | .............. | 438/618 |

OTHER PUBLICATIONS

Cho et al., "Double Patterning Technology Friendly Detailed Routing," IEEE/ACM International Conference on Computer-Aided Design (ICCAD 2008), San Jose, CA, Nov. 2008, pp. 506-511.
Gao et al., "Enhancing Double-Patterning Detailed Routing with Lazy Coloring with Within-Path Conflict Avoidance," Design, Automation & Test in Europe conference & Exhibition (DATE), Dresden, Germany, Mar. 2010, pp. 1279-1284.
Lin et al., "Double Patterning Lithography Aware Gridless Detailed Routing with Innovative Conflict Graph," 1010 47th ACM/IEEE Design Automation Conference (DAC), Anaheim, CA Jun. 2010, pp. 398-403.

(Continued)

*Primary Examiner* — Sun Lin
(74) *Attorney, Agent, or Firm* — Van Leeuwen & VanLeeuwen; Jonathan N. Geld

(57) ABSTRACT

An approach is provided in which an enhanced routing module creates connection objects on a double patterning layout that are correct-by-construction and do not require a semiconductor fabrication stitching process. The enhanced routing module efficiently tracks accumulated mask selection constraints, during maze expansion, when the enhanced routing module traverses possible connection routes from a source grid point to a target grid point. In turn, the enhanced routing module avoids grid points that impose mask selection constraints that are incompatible with existing mask selection constraints of the possible connection routes. As a result, a connection object created by any one of the possible connection routes can be assigned to a specific mask, thus avoiding stitching process requirements from a semiconductor fabrication facility.

20 Claims, 11 Drawing Sheets

(56) References Cited

OTHER PUBLICATIONS

Lin et al., "DOPPLER: DPL-aware and OPC-friendly Gridless Detailed Routing with Mask Density Balancing," 2011 IEEE/ACM International Conference on Computer-Aided Design (ICCAD), Nov. 2011, pp. 283-289.

Wu et al., "Maze Routing with OPC Consideration," Proceedings of the Design Automation Conference (ASP-DAC 2005), Shanghai, China, Jan. 2005, pp. 198-203.

\* cited by examiner

DOUBLE PATTERNING AWARE ROUTING WITHOUT STITCHING

TECHNICAL FIELD

The present disclosure relates to creating correct-by-construction possible connection routes during design layout route generation. More particularly, the present disclosure relates to tracking mask constraints during double patterning route generation to ensure that a generated connection route may be assigned to a specific mask and, in turn, avoid a stitching process step during semiconductor fabrication.

BACKGROUND

A semiconductor fabrication facility uses "masks" to create physical layers of material on a semiconductor wafer. Traditionally, the semiconductor fabrication facility uses one mask per physical layer to place/remove material on/from the semiconductor wafer. The material may be conductive (e.g., metal or polysilicon) or non-conductive based upon the purpose of each particular physical layer.

Masks are created from design layouts, which geometrically specify "open areas" on a particular physical layer for which to place/remove material. A design layout includes "objects" corresponding to component objects, such as a transistor gate, and connection objects (e.g., routes) that connect a component's output to a component's input. When a mask is created from the design layout, the masks include open areas corresponding to the component objects and connection objects included in the design layout. As such, when the mask is used in a semiconductor fabrication process, material is placed in the open areas on the semiconductor wafer.

In the process of creating connection objects, design layout tools may use "maze routing" algorithms to generate several "possible connection routes" (e.g., possible connection "paths") between a source grid point and a target grid point and, in turn, back track the "best" possible connection route to generate the connection object. Using this approach, the design layout tool partitions the design layout into a grid of "grid points" and performs a maze expansion, starting at the source grid point, until the maze search reaches a target grid point. The size of each grid point typically corresponds to a minimal spacing requirement of the semiconductor technology on which the resulting masks will be utilized.

Minimal spacing capabilities of advanced semiconductor technology processes, however, decrease a design layout's grid point sizing to a point at which a single mask may not able to achieve optimal routing densities due to photoresist pattern resolution limitations used with the masks. In other words, a single mask may not be able to place material on a semiconductor wafer corresponding to two objects in a design layout residing on adjacent grid points ("near" each other).

As such, "double patterning" was developed that utilizes two separate masks to create a single physical layer on a semiconductor wafer, thus allowing a semiconductor fabrication facility to produce minimum pitch features on the physical layer. Using a double patterning approach, a first mask is used to lay down a first set of material and a second mask is subsequently used to lay down a second set of material that is near the first set of material.

In certain situations (e.g., densely populated areas), a design layout tool that implements double patterning aware routing methods allows a segment of a connection object to be assigned to one mask, and another segment of the same connection object to be assigned to a different mask. In these situations, once the two masks are used to lay down two segments of material corresponding to the two segments of the connection object, the semiconductor fabrication facility "stitches" together the two segments of material with more material to complete the connection.

Some manufacturing facilities, however, do not support stitching as part of their semiconductor fabrication process. As such, the current double patterning routing methods may not create implementable double patterning masks.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

This disclosure provides a method of creating connection objects on a double patterning layout that are correct-by-construction and do not require a semiconductor fabrication stitching process. The method efficiently tracks accumulated mask selection constraints, during maze expansion, when an enhanced routing module creates a possible connection route from a source grid point to a target grid point. By tracking accumulated mask selection constraints of the possible connection route, the enhanced routing module avoids expanding the possible connection route into a grid point that imposes mask selection constraints incompatible with accumulated mask selection constraints already imposed on the possible connection route. As a result, each possible connection route created by the enhanced routing module is "correct-by-construction" and may be assigned, in its entirety, to a single mask, thus avoiding stitching capability requirements from a semiconductor fabrication facility. The enhanced routing module back tracks the "best" possible connection route based upon various connection cost factors and generates a connection object, assigned to a single mask, accordingly.

Figure 1:
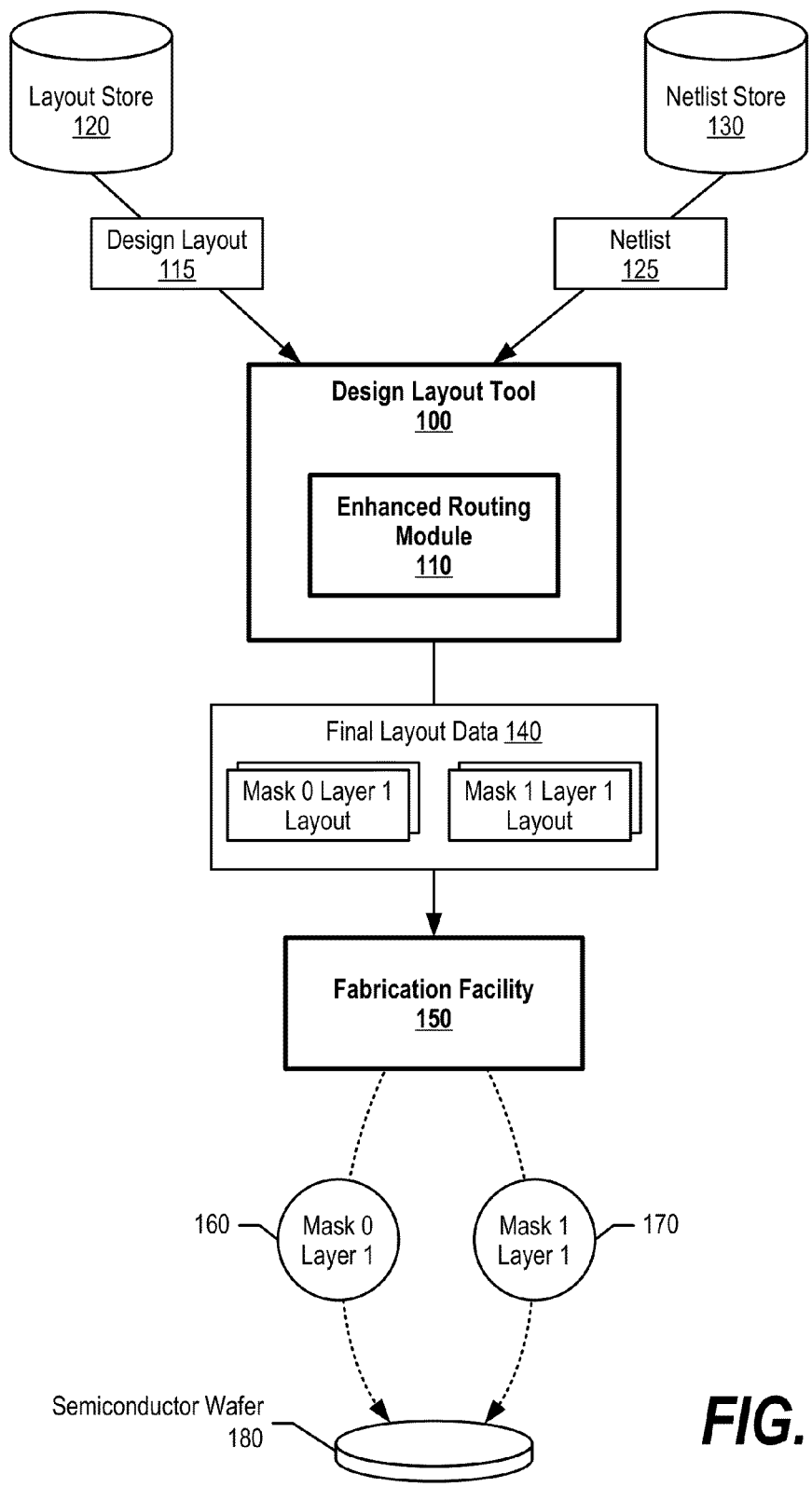
FIG. 1 is a diagram depicting a design layout tool using an enhanced routing module to generate correct-by-construction connection components on a double patterning mask layout.

FIG. 1 is a diagram depicting a design layout tool having an enhanced routing module to generate correct-by-construction connection components on a double patterning mask layout. As those skilled in the art can appreciate, a double patterning mask layout improves connection routing density on a semiconductor by generating two masks (masks 160 and 170) that are utilized by a semiconductor fabrication facility (fabrication facility 150) to create a single physical layer on a semiconductor wafer (semiconductor wafer 180).

Design layout tool 100 retrieves design layout 115 from layout store 120 that may be, for example, a partial layout that includes objects geometrically positioned on design layout 115. As discussed herein, an object may be a connection object and/or a component object (e.g., a transistor source, gate and/or drain). Design layout tool 100 configures design layout 115 into a grid of grid points, which enhanced routing module 110 utilizes as a basis to generate possible connection routes between source grid points and target grid points.

Design layout 115 may also include "groups" of objects, which are objects grouped together based on their nearness to one another (e.g., residing on adjacent grid points). As described herein, two objects are determined to be "near" each other when the spacing between them is less than a design rule value specified for a specific semiconductor process technology. Since they are near each other, their individual mask selection assignments are interrelated. For example, an object group may include two objects that are near each other and, in turn are required to be assigned to different masks (e.g., mask 0 160 and mask 1 170).

Design layout tool 100 retrieves netlist 125 from netlist store 130 that identifies nodes grouped into "nets" that require connecting (e.g., an input node and an output node). Design layout tool 100 transposes these nodes into source/target grid points on the grid of grid points. Enhanced routing module 110 selects a source grid point and a target grid point according to a net included in netlist 125, and commences steps to create a connection object between the source grid point and the target grid point.

Enhanced routing module 110 may utilize various routing approaches to generate connection objects between a source grid point and a target grid point, such as using a maze routing technique. Maze routing includes two processes: a search process (maze expansion) and a back track process. The search process commences at the source grid point and creates multiple "possible connection routes" by traversing through various grid points towards the target grid point. In one embodiment, enhanced routing module 110 selects a source grid point and deems the other grid points in the net as target grid points. In this embodiment, enhanced routing module 110 finds the lowest cost target grid point (e.g., closest) to the source grid point during the maze expansion phase.

The back track process commences at the target grid point and selects a "best" possible connection route based upon various connection cost factors discussed herein. The back track process follows the grid points assigned to the best possible connection route towards the source grid point and generates a connection object based upon the back tracked grid points. As those skilled in the art can appreciate, the enhanced routing module techniques discussed herein may be utilized with other connection routing methods besides maze routing.

Enhanced routing module 110 "assigns" a series of grid points to a possible connection route (e.g., generates back pointers) as the possible connection route traverses towards the target grid point. During the traversal process, enhanced routing module 110 selects a "neighbor" grid point, which is a grid point adjacent to a grid point already assigned to the series of grid points comprising the possible connection route, and compares mask selection constraints of the neighbor grid point to existing mask selection constraints of the possible connection route (see FIGS. 2-4 and corresponding text for further details).

For example, the possible connection route may traverse near an object on the same layer that is assigned to mask 0, which requires the possible connection route to be assigned to mask 1. In this example, when enhanced routing module 110 identifies a neighbor grid point adjacent to an object that is assigned to mask 1 (therefore requiring the possible connection route to be assigned to mask 0), enhanced routing module 110 avoids traversing into the neighbor grid point because the possible connection route is already required to be assigned to mask 1. Once enhanced routing module 110 reaches the target grid point, enhanced routing module 110 performs back tracking steps (using the back pointers) and creates a connection object.

To maintain mask selection flexibility, enhanced routing module 110 assigns "relative" mask assignments (relative mask assignment identifiers) to connection objects. The relative mask assignment identifiers indicate a particular mask "number", but the mask number may change during the design layout routing process by changing nearby object mask assignments (see FIGS. 5, 6, and corresponding text for further details). This provides mask selection flexibility until design layout tool 100 assigns fixed mask assignments (numbers) and generates final layout data 140 that includes layout information for two separate masks targeted for a single physical layer.

Fabrication facility 150 receives final layout data 140 and generates mask 0 160 and mask 1 170. In one embodiment, a third party fabrication facility generates the masks from final layout data 140 and provides the masks to fabrication facility 150. In turn, fabrication facility 150 uses mask 0 160 and mask 1 170 to generate physical objects (corresponding to the connection objects and component objects) a physical layer on semiconductor wafer 180.

Figure 2:
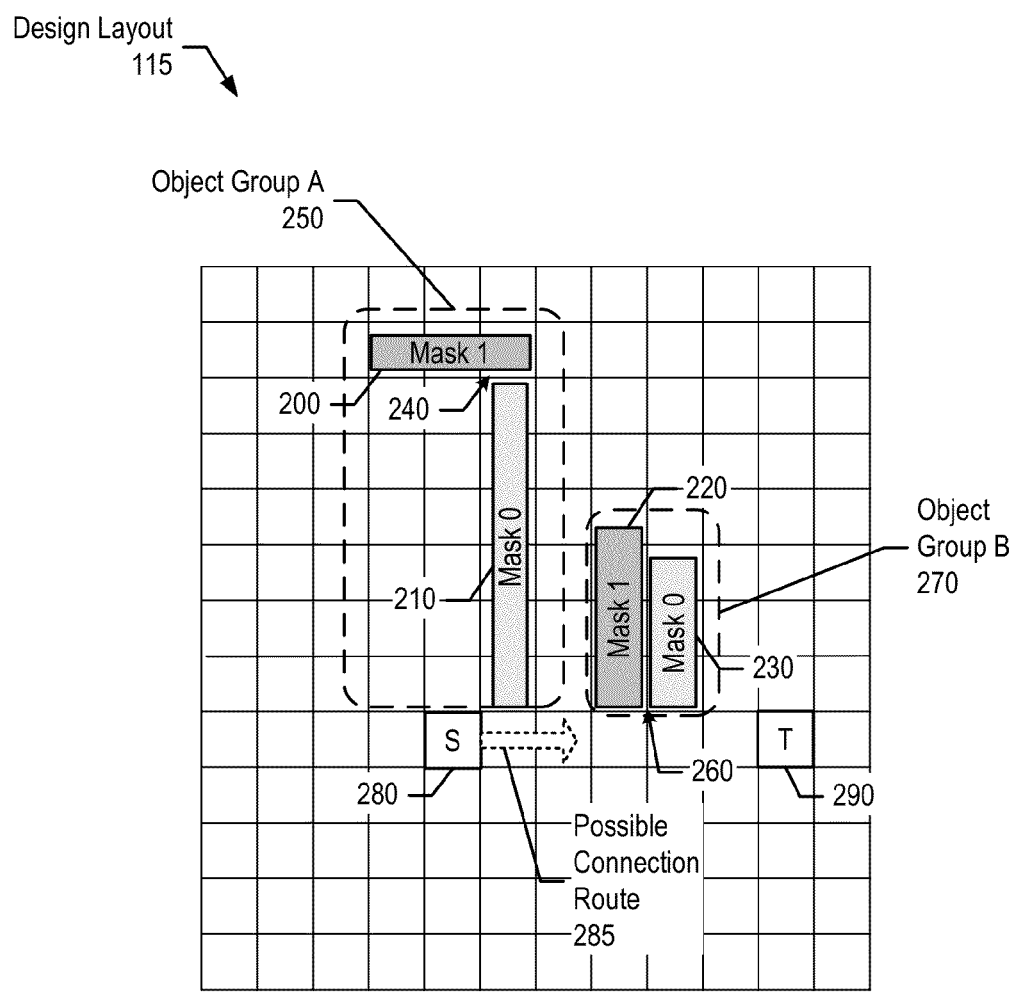
FIG. 2 is a diagram illustrating a possible connection route being created between a source grid point and a target grid point.

FIG. 2 is a diagram illustrating a possible connection route being created between a source grid point and a target grid point. Design layout 115 includes objects 200, 210, 220, and 230, which may correspond to component objects and/or connection objects. When objects are "near" each other (e.g., residing on adjacent grid points), the objects are assigned to the same group in order to maintain mask assignment interdependency between the objects. As can be seen, design layout 115 includes object group A 250 and object group B 270. Object group A 250 includes objects 200 and 210, which are near each other at location 240. Object group B 270 includes objects 220 and 230, which are near each other at location 260. The four objects are not assigned to one larger group because object 210 is not near object 220 (e.g., they do not reside on grid points adjacent to each other).

Enhanced routing module 110 selects source grid point 280 and target grid point 290 according to netlist 125 and begins steps to create possible connection routes. As those skilled in the art will appreciate, maze expansion may begin creating multiple possible connection routes in many different directions. However, for simplicity purposes, FIG. 2 depicts one possible connection route 285.

Figure 3:
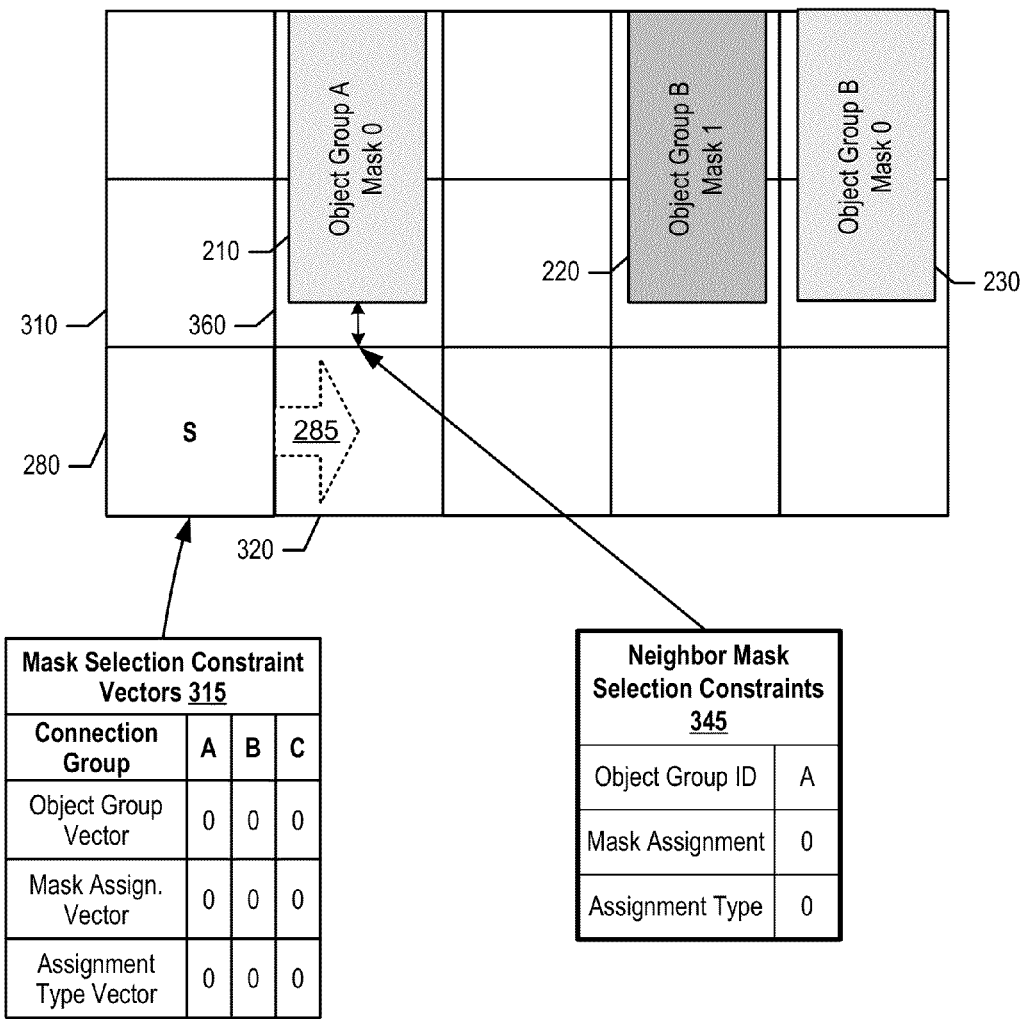
FIG. 3 is a diagram showing a possible connection route expanding into a neighbor grid point.
Figure 4:
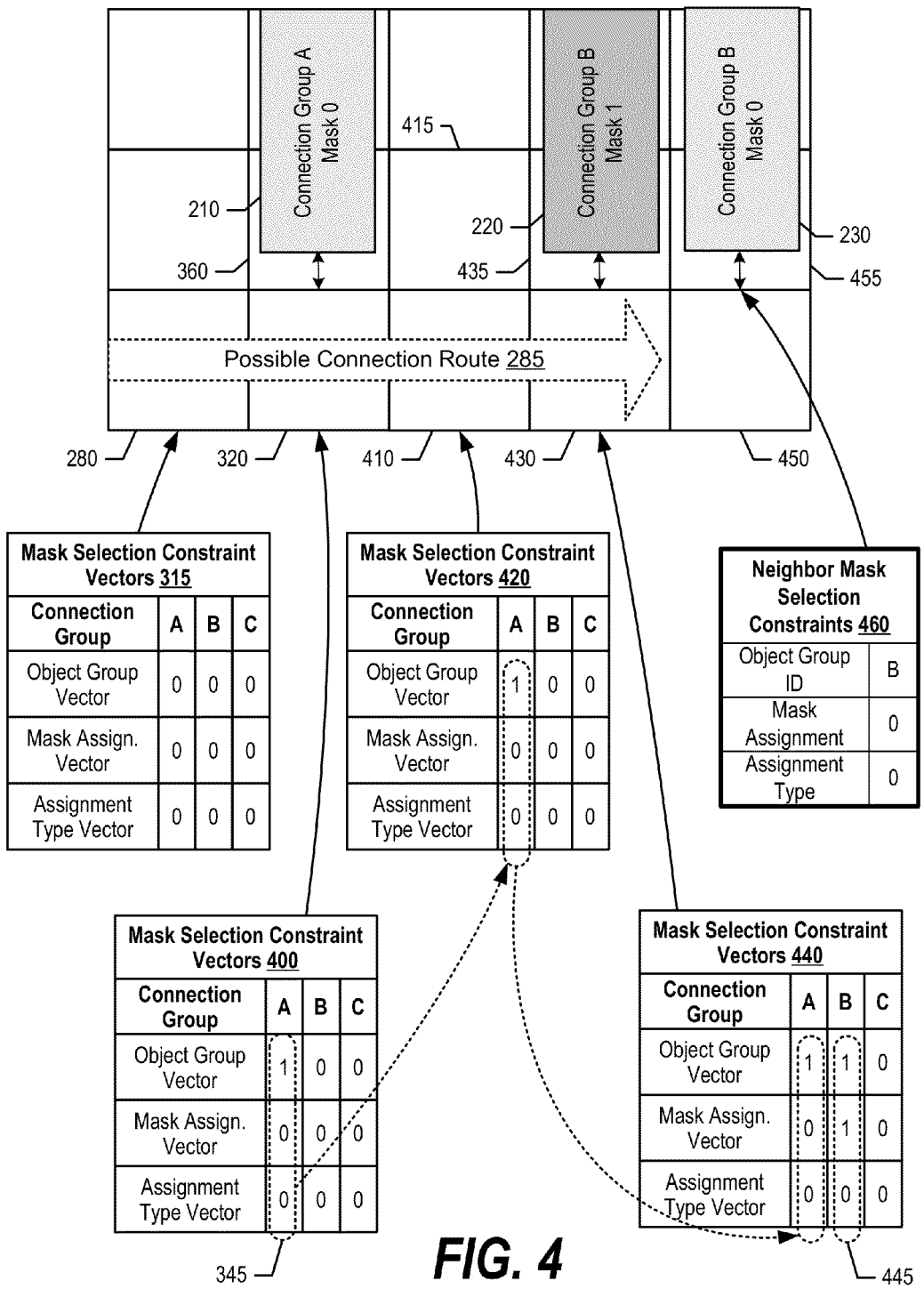
FIG. 4 is a diagram illustrating a possible connection route encountering a neighbor grid point having incompatible mask selection constraints.

As enhanced routing module 110 expands possible connection route 285 into grid points towards target grid point 290, enhanced routing module 110 analyzes mask selection constraints of the grid points in order to ensure that possible connection route 285 is able to be assigned to at least one of two masks (see FIGS. 3, 4, and corresponding text for further details).

FIG. 3 is a diagram showing a possible connection route expanding into a neighbor grid point. When enhanced routing module 110 begins maze expansion, enhanced routing module 110 analyzes mask selection constraints imposed on the source grid point (grid point 280) from objects residing on adjacent grid points. As can be seen, grid point 280's adjacent grid points 310 and 320 do not currently include an object and, as such, grid point 280 does not have any mask selection constraints. In one embodiment, adjacent grid points "share" a side and that a grid point only sharing a corner (e.g., grid point 360) is not considered an adjacent grid point to grid point 280.

To track mask selection constraints as possible connection route 285 traverses towards target grid point 290, enhanced routing module 110 generates "constraint vectors" for each grid point assigned to possible connection route 285. Enhanced routing module 110 generates mask selection constraint vectors 315 for grid point 280, which include an object group vector (includes object group identifiers), a mask assignment vector (includes mask assignments), and an assignment type vector. The object group vector logs nearby object groups and the mask assignment vector logs the nearby object's mask assignments (e.g., mask 0 or mask 1). The assignment type vector indicates the type of mask assignment (e.g., relative mask assignment or fixed mask assignment). As can be seen, since grid point 280 does not have any mask selection constraints (no nearby objects), constraint vectors 315 do not indicate any constraints.

Enhanced routing module 110 identifies grid point 320 as a neighbor grid point and, prior to expanding into grid point 320, enhanced routing module 110 compares constraint vectors 315 with mask selection constraints of grid point 320. As can be seen, since object 210 resides on grid point 360, which is adjacent to grid point 320, object 210 imposes neighbor mask selection constraints 345 on grid point 320. Based upon object 210's mask assignment identifier and object group association, neighbor mask selection constraints 345 include a constraint of "object group A, relative mask assignment 0" (assignment type 0=relative constraint).

Enhanced routing module 110 determines that neighbor mask selection constraints 345 are compatible with mask selection constraint vectors 315 because, for example, constraint vectors 315 do not include any constraints, and especially because mask selection constraint vectors do not include a constraint corresponding to object group A. As such, enhanced routing module 110 expands possible connection route 285 into grid point 320 and generates a new set of mask selection constraint vectors for grid point 320 that combines constraint vectors 315 with neighbor mask selection constraints 345 (see FIG. 4 and corresponding text for further details).

FIG. 4 is a diagram illustrating a possible connection route encountering a neighbor grid point having incompatible mask selection constraints. When enhanced routing module 110 expanded possible connection route 285 into grid point 320 as discussed in FIG. 3, enhanced routing module 110 generated mask selection constraint vectors 400, which combined mask selection constraint vectors 315 with neighbor mask selection constraints 345. As such, mask selection constraints 400 indicates a mask selection constraint of "object group A, relative mask assignment 0" (assignment type of 0 indicates a relative mask assignment).

When enhanced routing module 110 evaluates expanding into grid point 410 from grid point 320, enhanced routing module 110 determines that grid point 410's adjacent grid points 415 and 430 do not include an object and, therefore, does not have neighbor mask selection constraints. As such, enhanced routing module 110 expands possible connection route into grid point 410 and creates mask selection constraint vectors 420, which carry over constraints 345 (but do not add new constraints since grid point 410 does not have any additional constraints as discussed above).

When enhanced routing module 110 evaluates expanding into grid point 430 from grid point 410, enhanced routing module 110 determines that grid point 430's adjacent grid point 435 includes object 220, which imposes a neighbor mask selection constraint of "object group B, relative mask assignment 1.", Since grid point 430's neighbor mask selection constraint corresponds to object group B and possible connection route 285's mask selection constraints (mask selection constraint vectors 420) currently have only a constraint corresponding to object group A, grid point 430's neighbor mask selection constraints are compatible and, as such, enhanced routing module 110 expands possible connection route 285 into grid point 430. In turn, enhanced routing module 110 generates mask selection constraint vectors 440, which carries over constraints 345 shown in FIG. 3 and adds grid point 430's neighbor mask selection constraints (mask selection constraints 445).

When enhanced routing module 110 evaluates expanding into grid point 450 from grid point 430, grid point 450's adjacent grid point 455 includes object 230, which imposes a neighbor mask selection constraint of "object group B, relative mask assignment 0. Enhanced routing module 110 determines that possible connection route 285's mask selection constraint vectors 440 currently have a constraint corresponding to object group B, which has a corresponding relative mask assignment of 1. As such, since neighbor mask selection constraints 460 include a relative mask assignment of 0, enhanced routing module 110 determines that neighbor mask selection constraints 460 are incompatible with mask selection constraint vectors 440 and, in turn, prohibits possible connection route 285 from expanding into grid point 450. As a result, enhanced routing module 110 expands possible connection route in a different direction, or on different layers, to reach target grid point 290.

Figure 5:
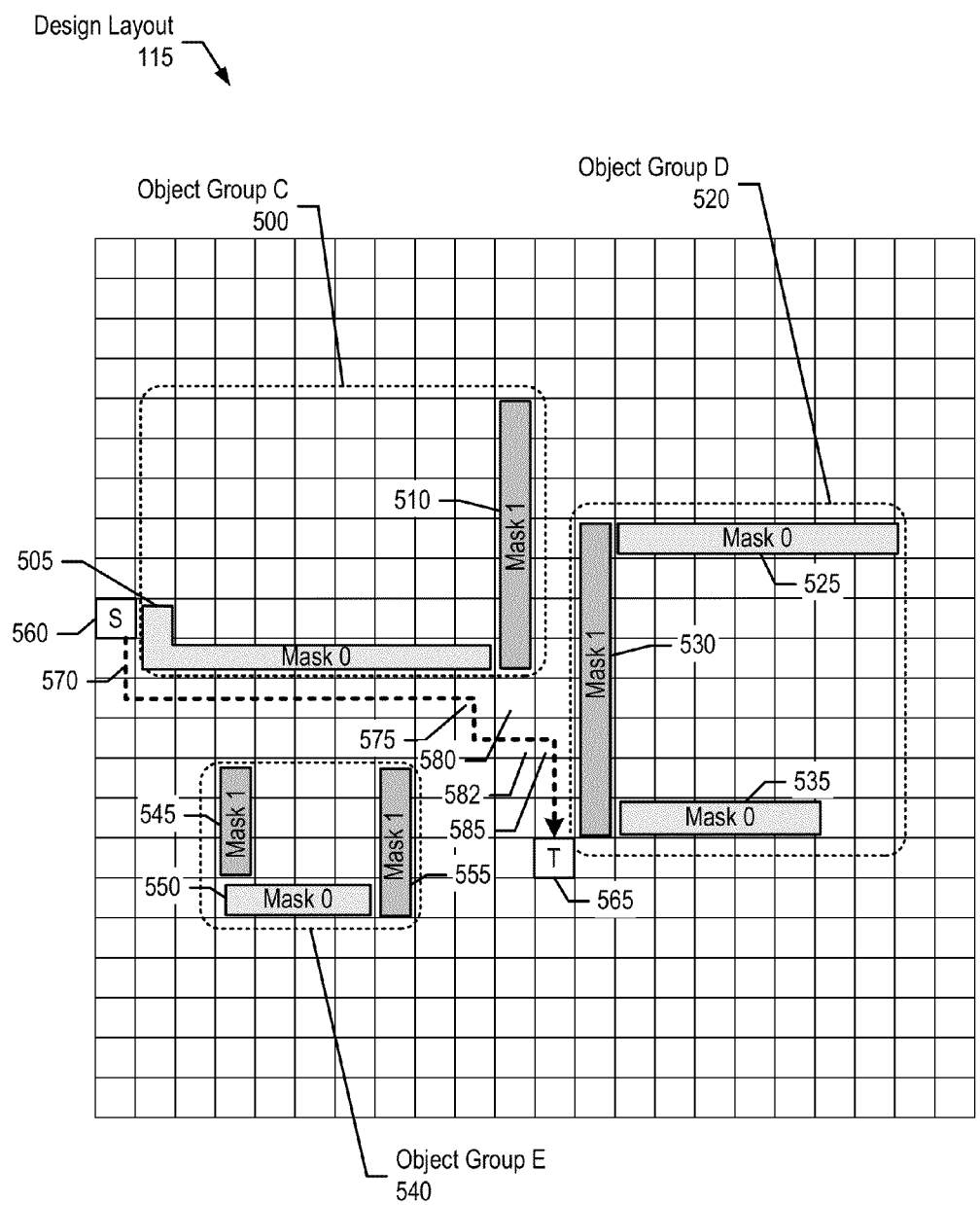
FIG. 5 is a diagram illustrating a possible connection route traversing between multiple object groups.

FIG. 5 is a diagram illustrating a different section of design layout 115 that includes three object groups. Object group C 500 includes objects 505 and 510. Object group D 520 includes objects 525, 530, and 535. And, object group E 540 includes objects 545, 550, and 555.

Enhanced routing module 110 performs maze expansion steps to identify possible connection routes from source grid point 560 to target grid point 565. The diagram in FIG. 5 does not show each of the possible connection routes identified by enhanced routing module 110 for simplicity purposes, but rather shows one particular possible connection route 570 traversing along grid points near object group C 500 and object group D 520.

When enhanced routing module 110 begins to expand possible connection route 570, object 505 imposes mask selection constraints on source grid point 560. As such, enhanced routing module 110 generates mask selection constraint vectors that include constraint "object group C, relative mask assignment 0." Enhanced routing module 570 traverses possible connection route 570 parallel to object 505 without adding additional mask selection constraints to the traversed grid points up to grid point 575.

After possible connection route 570 expands into grid point 575, enhanced routing module 110 evaluates neighbor mask selection constraints imposed on grid point 580. As can be seen, since object 510 resides on a grid point adjacent to grid point 580, grid point 580 has a neighbor mask selection constraint of "object group C, relative mask assignment 1," which is incompatible with possible connection route 570's existing mask selection constraint of "object group C, relative mask assignment 0." As such, enhanced routing module 110 avoids expanding possible connection route 570 into grid point 580 and routes possible connection route 570 around grid point 580.

When enhanced routing module 110 reaches grid point 582 and evaluates neighbor grid point 585, enhanced routing module 110 detects object 530 residing on a grid point adjacent to grid point 585. Grid point 585 has a neighbor mask selection constraint of "object group D, relative mask assignment 1." Since possible connection route 570 does not yet have mask selection constraints corresponding to object group D 520, the constraints are compatible and enhanced routing module 110 expands possible connection route 570 into grid point 585 and eventually ending at target grid point 565.

When enhanced routing module 110 performs maze back track steps to create a new connection object from possible connection route 570, the new connection object, objects included in object group C 500, and objects included in object group D 520 are combined into a single object, since the newly created connection object is near both object groups. In addition, enhanced routing module 100 may change relative mask assignments of some of the objects in response to combining the objects into one group (see FIG. 6 and corresponding text for further details).

Figure 6:
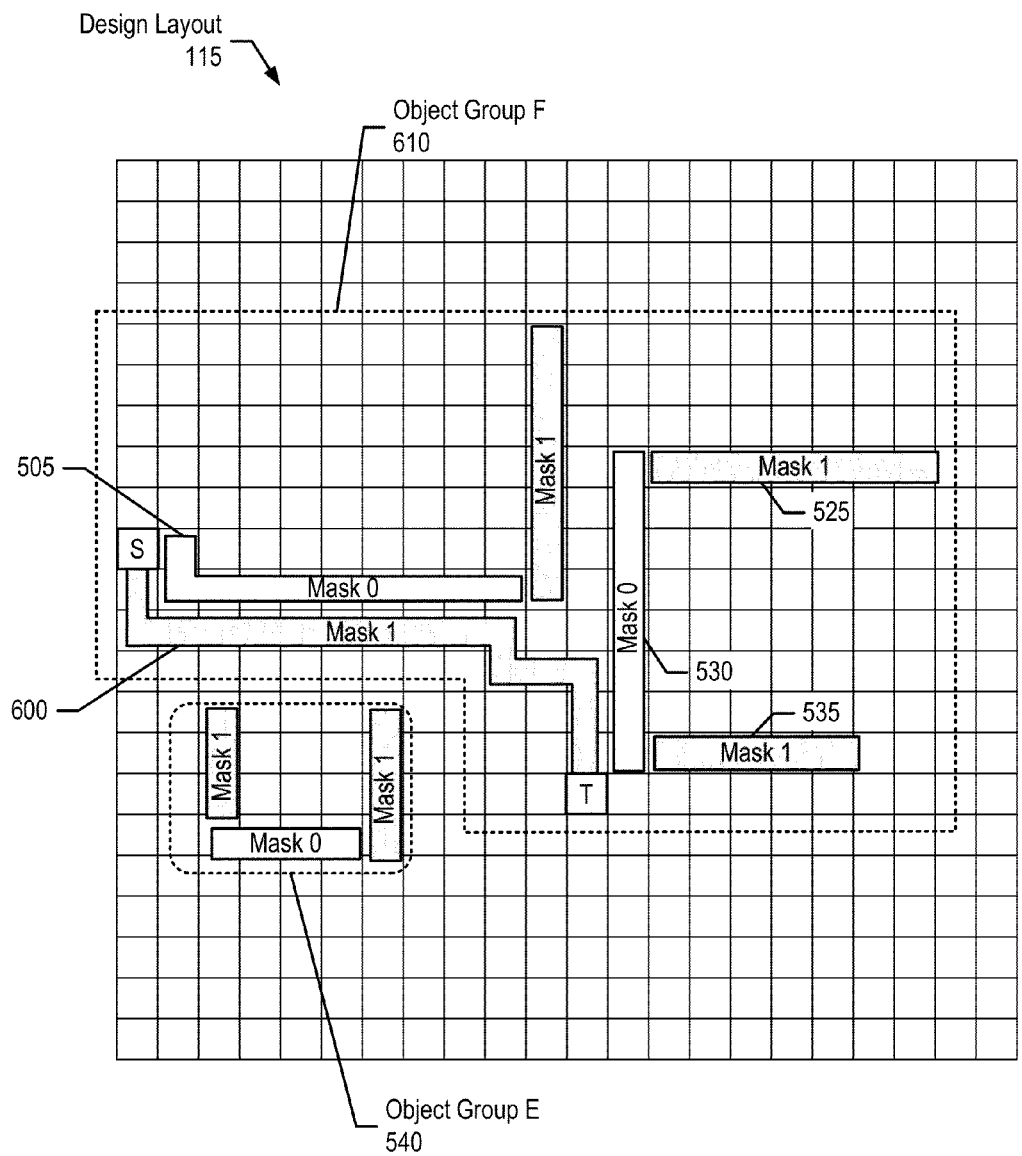
FIG. 6 is a diagram depicting a combined object group in response to creating a new connection object that is near two previously separated object groups.

FIG. 6 is a diagram depicting a combined object group in response to creating a new connection object that is near two previously separated object groups. Enhanced routing module 110 back tracks possible connection route 570 shown in FIG. 5 and generates connection object 600. Since connection object 600 is near both object 505 (originally included in object group C 500) and object 530 (originally included in object group D 520), enhanced routing module 110 creates a new object group F 610 that includes connection object 600 and each of the objects originally included in object group C 500 and object group D 520.

Objects 525, 530, and 535 have "relative" mask assignments, which means that they are not yet permanently assigned to any particular mask. As such, since enhanced routing module 110 assigned mask assignment 1 to object 600 (due to mask selection constraints imposed by object 505), enhanced routing module 110 changes the mask assignment of object 530 from mask assignment 1 (shown in FIG. 5) to mask assignment 0 (shown in FIG. 6) due to object 530's nearness to object 600. Likewise, enhanced routing module 100 changes the mask assignment of objects 525 and 535 from mask assignment 0 (shown in FIG. 5) to mask assignment 1 (shown in FIG. 6) due to their nearness to object 530.

Figure 7:
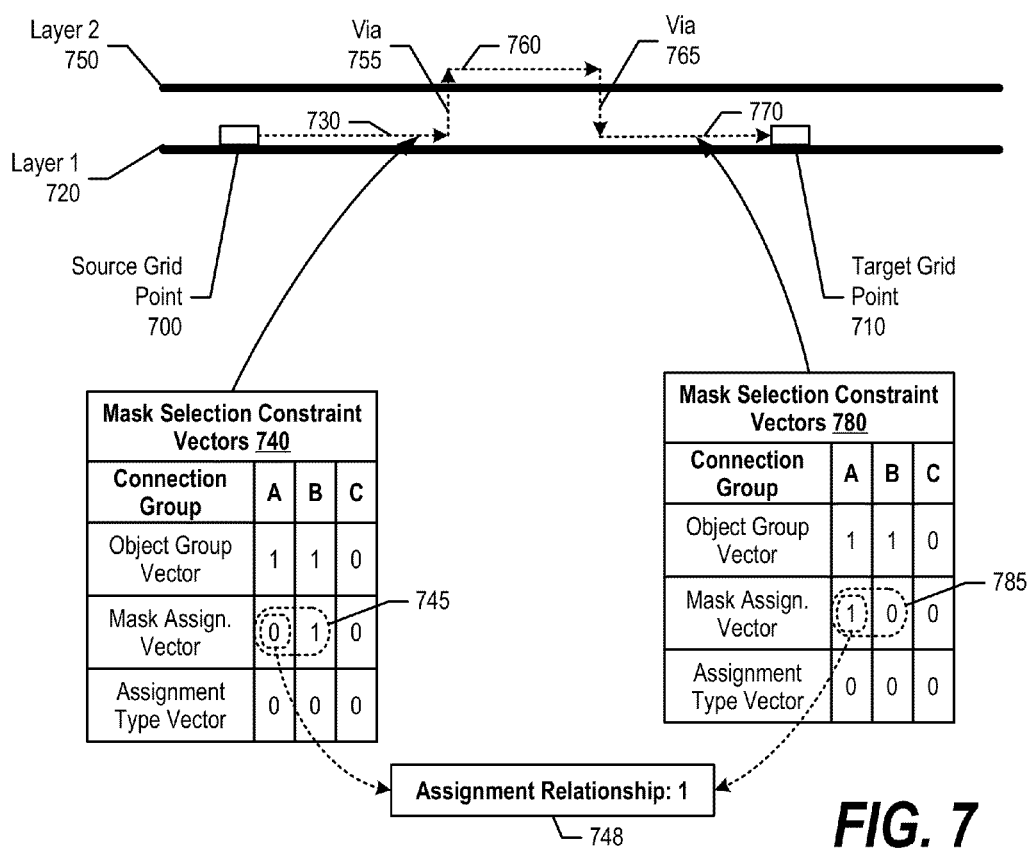
FIG. 7 is a diagram illustrating an enhanced routing module creating a possible connection route on multiple design layout layers.

FIG. 7 is a diagram illustrating an enhanced routing module creating a possible connection route on multiple design layout layers to route to a target grid point. For example, due to existing object congestion, enhanced routing module 110 may route a possible connection route above or below the physical layer on which the source grid point and target grid point reside. When this occurs, enhanced routing module 110 retains some information pertaining to the first layer's constraints and clears other information (discussed below).

Enhanced routing module 110 tracks an "assignment relationship" between multiple object group mask selection constraints on a per design layer basis. This is due to the fact that, as shown in FIGS. 5 and 6, when a possible connection route comes near two different object groups, enhanced routing module 110 "flips" the phase (assignment) of each one of a group's objects when the near objects have different mask assignments (object 505 and 530). As such, enhanced routing module 110 stores the assignment relationship between the same group on different layer visits as the possible connection route traverses different design layout layers.

FIG. 7 shows source grid point 700 and target grid point 710 on design layout layer 1. As enhanced routing module 110 creates a first section of the possible connection route (section 730), enhanced routing module 110 generates mask selection constraint vectors 740. Mask selection constraint vectors 740 indicate that section 730 is near an object in object group A with a relative mask assignment of 0, and an object in object group B with a relative mask assignment of 1.

When enhanced routing module 110 traverses the possible connection route through via 755 up to design layout layer 2 750, enhanced routing module 110 stores constraints accumulated from layer 1 (mask selection constraint vectors 740) to a master list, and clears the mask selection constraint vectors for the current visit to layer 2, because object groups in design layer 2 750 are unrelated to object groups in design layer 1 720. In turn, enhanced routing module 110 generates another segment of the possible connection route (segment 760) and may generate different mask selection constraint vectors for segment 760.

Enhanced routing module 110 traverses the possible connection route through via 765 back to design layout layer 1 720 and begins a new set of mask selection constraint vectors 780 (current constraint vectors) to generate segment 770. As segment 770 traverses towards target grid point 710 it comes near an object in object group A with a relative mask assignment of 1. Enhanced routing module 110 compares this current mask assignment of object group A in mask selection constraints 780 to the assignment of object group A of its previous constraint vectors 740. Since they are opposite values, enhanced routing module 110 determines that the "assignment relationship" 748 between these constraints is "1" (e.g., opposite each other). Enhanced routing module 110 subsequently encounters an object in object group B with a relative mask assignment of 0. Although constraints 745 of the previous constraint vectors and 785 of the current constraint vectors are different from each other, enhanced routing module 110 checks assignment relationship 748 and determines that, since constraints 785 are opposite each other and the assignment relationship is 1, constraints 745 and 785 are compatible.

As such, when enhanced routing module 110 back tracks the possible connection route to create a connection object, enhanced routing module 110 may flip the relative mask assignments of each object included in either object group A or object group B. In contrast, if constraints 785 were both 0, enhanced routing module 110 would be required to flip the mask assignments of each object in object group A or object group B according to constraints 745, but would be restricted from performing such flip according to constraints 785. As such, enhanced routing module 110 tracks the assignment relationship between object group constraints on a per design layout layer basis.

Figure 8:
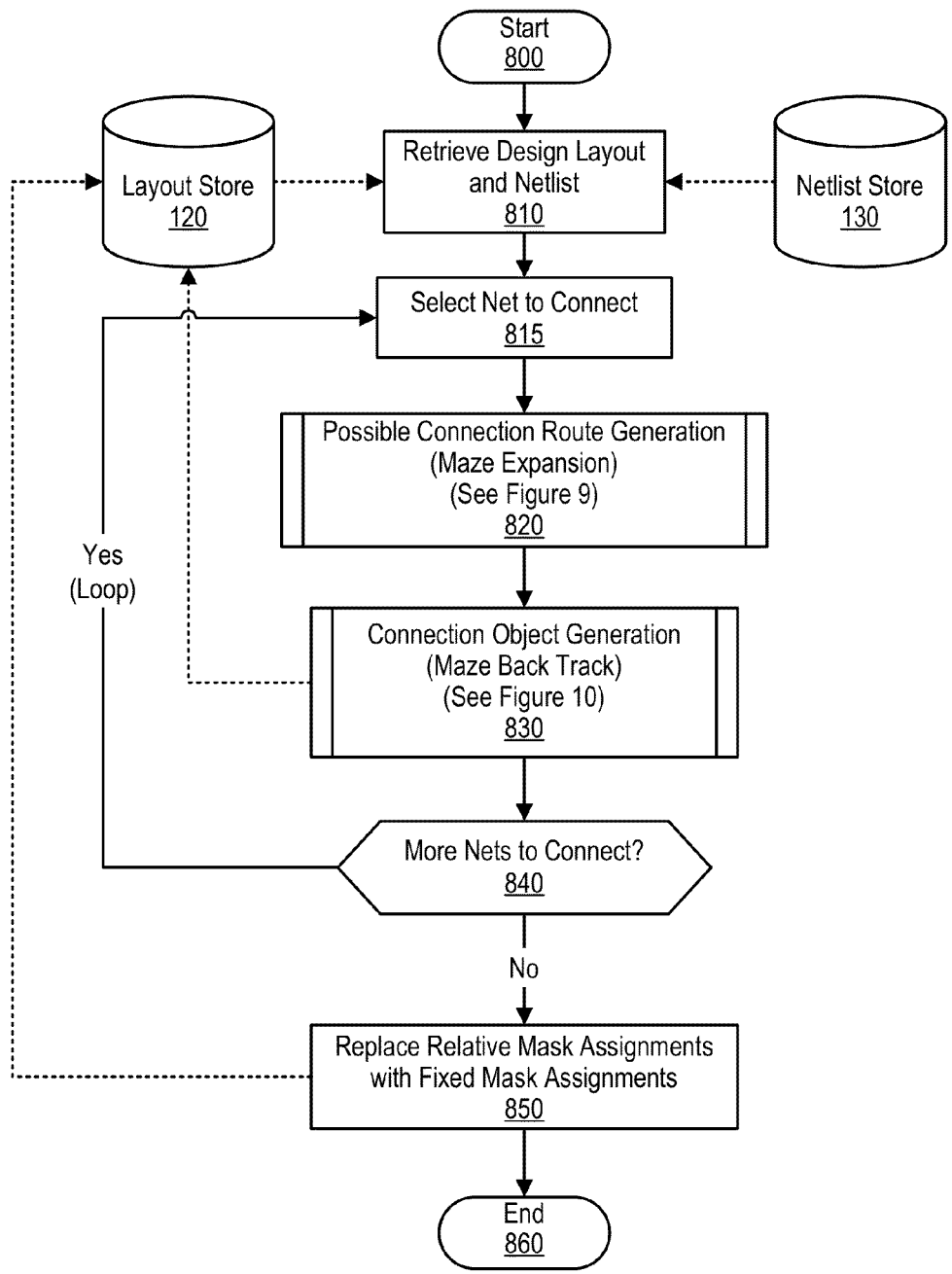
FIG. 8 is a high level flowchart showing steps taken in generating possible connection routes and creating connection objects from the possible connection routes.

FIG. 8 is a high level flowchart showing steps taken in generating possible connection routes and creating connection objects from the possible connection routes. Processing commences at 800, whereupon the design layout tool retrieves a design layout from layout store 120 and a netlist from netlist store 130 (step 810). As discussed herein, the design layout (design layout 115) may be, for example, a partial layout that includes connection objects and/or component objects, and the netlist (netlist 125) includes information that the design layout tool utilizes to connect source grid points (e.g., corresponding to a component output) to target grid points (e.g., corresponding to a component input).

At step 815, the design layout tool (or enhanced routing module) selects a "net" from the netlist. A net is a group of nodes to connect, such as a source node to a target node. The design layout tool transfers source/target node locations to grid point locations and selects one of the grid points as a source grid point. In turn, the design layout tool begins possible connection route generation (maze expansion) to generate possible connection routes from the source grid point to the target grid point (pre-defined process block 820, see FIG. 9 and corresponding text for further details). The design layout tool then performs maze back track steps to create a connection object from the "best" one of the possible connection routes based upon connection object cost factors (pre-defined process block 830, see FIG. 10 and corresponding text for further details).

In one embodiment, as those skilled in the art can appreciate, a net may include more than two nodes to connect (e.g., one output to four inputs). In this embodiment, the design layout tool transfers node locations to grid point locations and selects one of the grid points as a source grid point and deems the other grid points as target grid points. The design layout tool finds the closest target grid point during the maze expansion phase (generating possible connection routes) and then performs a back track operation to create an object from one of the possible connection routes. The design layout tool then proceeds to select another one of the grid points as a source grid point, deems the other grid points as target grid points, and performs maze expansion and backtrack steps. This process continues until each grid point (source/target grid point) is connected to each other grid point corresponding to the net.

A determination is made as to whether there are any more nets included in the netlist to connect (decision 840). If there are more nets to connect, decision 840 branches to the "Yes" branch, which loops back to select and process the next net. This looping continues until there are no more nets to connect, at which point decision 840 branches to the "No" branch.

At step 850, the design layout tool replaces each of the connection objects' relative mask assignments with fixed mask assignments. The design layout tool performs this step as late in the process as possible in order to maintain flexibility throughout the possible connection route/connection object generation process. Processing ends at 860.

Figure 9:
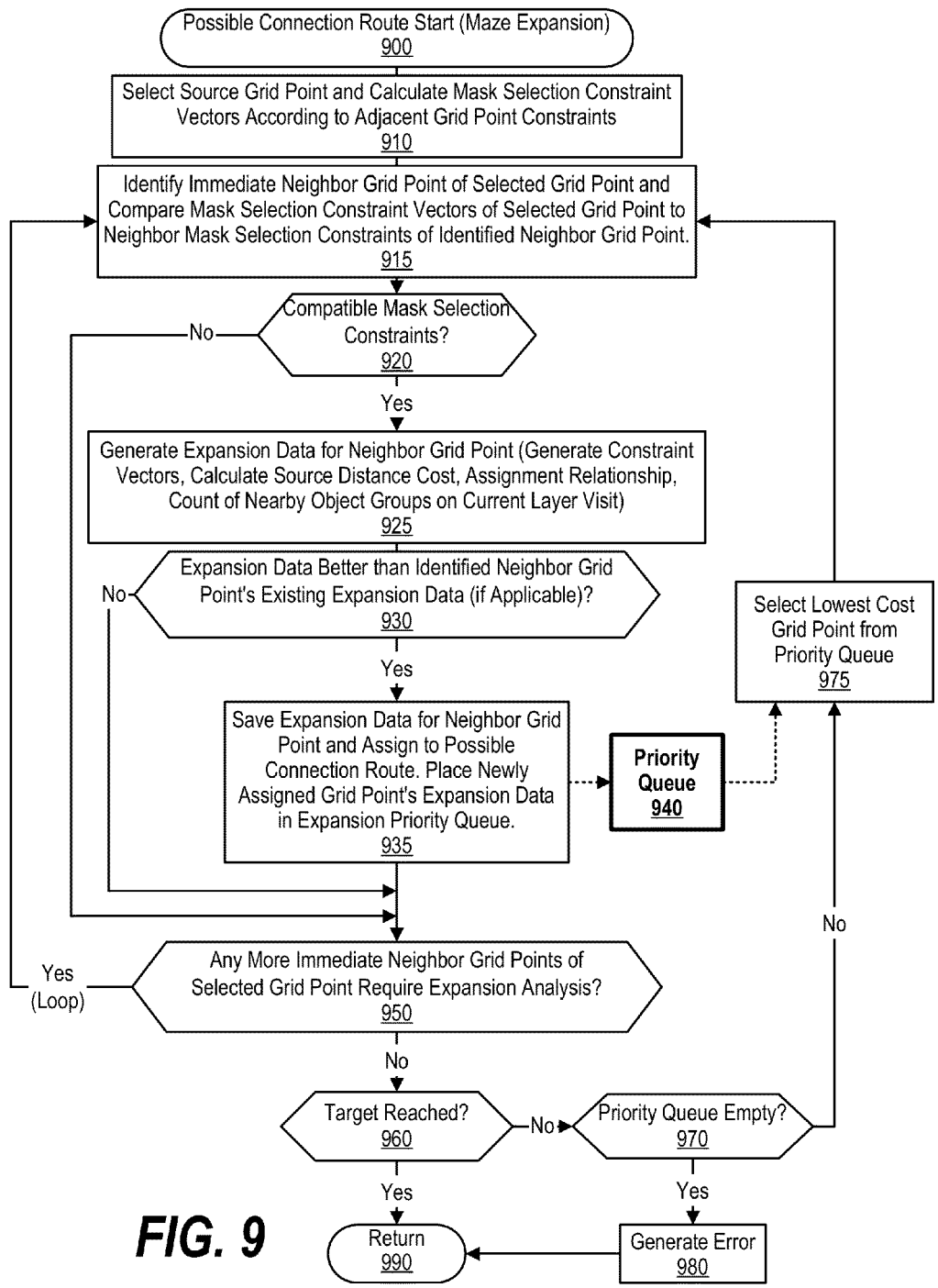
FIG. 9 is a flowchart showing steps taken in an enhanced routing module generating possible connection routes originating at a source grid point and ending at a target grid point.

FIG. 9 is a flowchart showing steps taken in a design layout tool generating possible connection routes originating at a source grid point and ending at a target grid point. Processing commences at 900, whereupon the design layout tool selects a source grid point (e.g., from netlist 125) and calculates constraint vectors for the source grid point according to objects residing on adjacent grid points (step 910). For example, FIG. 5 shows that source grid point 560's adjacent grid point includes object 505 and, as such, the enhanced routing module generates constraint vectors that include an object group C, relative mask assignment 0 constraint.

At step 915, the design layout tool selects a neighbor grid point to the source grid point and compares the constraint vectors of the source grid point with neighbor mask selection constraints corresponding to the neighbor grid point. Referring to FIG. 3, the design layout tool selects neighbor grid point 320 and compares mask selection constraint vectors 315 with neighbor mask selection constraints 345. A determination is made as to whether the two mask selection constraints are compatible (decision 920). In one embodiment, the design layout tool first checks whether the mask selection constraint vectors and the neighbor mask selection constraints include a matching object group identifier (e.g., object group B). If they do not include a matching object group identifier, the design layout tool determines that the constraints are compatible.

If the two constraints are incompatible (e.g., object group B, relative mask assignment 0 compared with object group B, relative mask assignment 1), decision 920 branches to the "No" branch, bypassing route expansion steps into the neighbor grid point, thus avoiding the neighbor grid point. On the other hand, if the two constraints are compatible, decision 920 branches to the "Yes" branch, whereupon, at step 925, the design layout tool generates expansion data for the neighbor grid point, which includes generating constraint vectors for the expanded neighbor grid point (as shown in FIGS. 3 and 4). The expansion data also includes a source distance cost, an assignment relationship for each layer, and a count of nearby object groups on the current layer visit. The source distance cost may be based on, for example, the number of grid points (distance) from the source grid point and the number of vias. The assignment relationship, as discussed in FIG. 7, indicates a relationship between mask assignment constraints from multiple visits to a layer. In one embodiment, the count of nearby object groups on the current layer pertains to the number of object groups the possible connection route is near on a current layer visit.

A determination is made as to whether the newly generated expansion data is better than expansion data currently stored for the neighbor grid point (if applicable, decision 930). As those skilled in the art can appreciate with maze expansion, the neighbor grid point may have been previously expanded into by a different possible connection route, which stored expansion data into the neighbor grid point. In one embodiment, the design layout tool determines if the newly generated expansion data is better than the existing expansion data by the formula:

$$\text{connection cost} = \text{distanceFromSource} + CV\_\text{weight}\_\text{relativenumberOfRelativeConstraintsToCCs} + CV\_\text{weight}\_\text{absolutenumberOfAbsoluteConstraintsToCCs}.$$

In the above formula, distanceFromSource is the distance (e.g., number of grid points) of the possible connection route; CV_weight_relative is a weighting to apply (e.g., user specified) to the number of relative mask assignment constraints (numberOfRelativeConstraintsToOGs); and CV_weight_fixed is a weighting to apply (e.g., user specified) to the number of fixed mask assignment constraints (numberOfFixedConstraintsToOGs).

If the newly generated expansion data is not better than the existing expansion data, decision 930 branches to the "No" branch, bypassing expanding the current possible connection route into the neighbor grid point. On the other hand, if the neighbor grid point does not include expansion data or if the newly generated expansion data is better than the existing expansion data, decision 930 branches to the "Yes" branch, whereupon the design layout tool saves the newly generated expansion data for the neighbor grid point in a storage location associated with the neighbor grid point, and assigns the neighbor grid point to the possible connection route (step 935). In addition, the design layout tool places the expansion data in priority queue 940, which the design layout tool uses to determine which grid point to analyze next during maze expansion (discussed below).

A determination is made as to whether the selected grid point has any more immediate neighbor grid points that require expansion analysis (decision 950). In one embodiment, the design layout tool analyzes grid points located on different design layout layers. If there are more grid points that require analysis, decision 935 branches to the "Yes" branch, which loops back to analyze and generate more expansion data. This looping continues until there are no more neighbor grid points that require expansion analysis, at which point decision 950 branches to the "No" branch.

A determination is made as to whether the target grid point has been reached (decision 960). If the target grid point has been reached, decision 960 branches to the "Yes" branch, whereupon processing returns at 990 and the design layout tool commences a maze back tracking process (see FIG. 10 and corresponding text for further details). In another embodiment, expansion of grid points continues after the target grid point has been reached until the lowest cost grid point in the priority queue is larger than the lowest cost possible connection route that has reached the target grid point.

On the other hand, if the target grid point has not been reached, decision 960 branches to the "No" branch, whereupon a determination is made as to whether priority queue 940 is empty (decision 970). If the priority queue is empty, decision 970 branches to the "Yes" branch, whereupon processing generates an error (step 980) and returns at 990.

On the other hand, if priority queue 940 is not empty, decision 970 branches to the "No" branch, whereupon the design layout tool selects the lowest cost grid point (e.g., using the formula above) from priority queue 940 at step 975, and proceeds to evaluate neighbor grid points of the selected lowest cost grid point. This looping continues until the target grid point has been reached or priority queue 940 is empty, at which point processing returns at 990.

Figure 10:
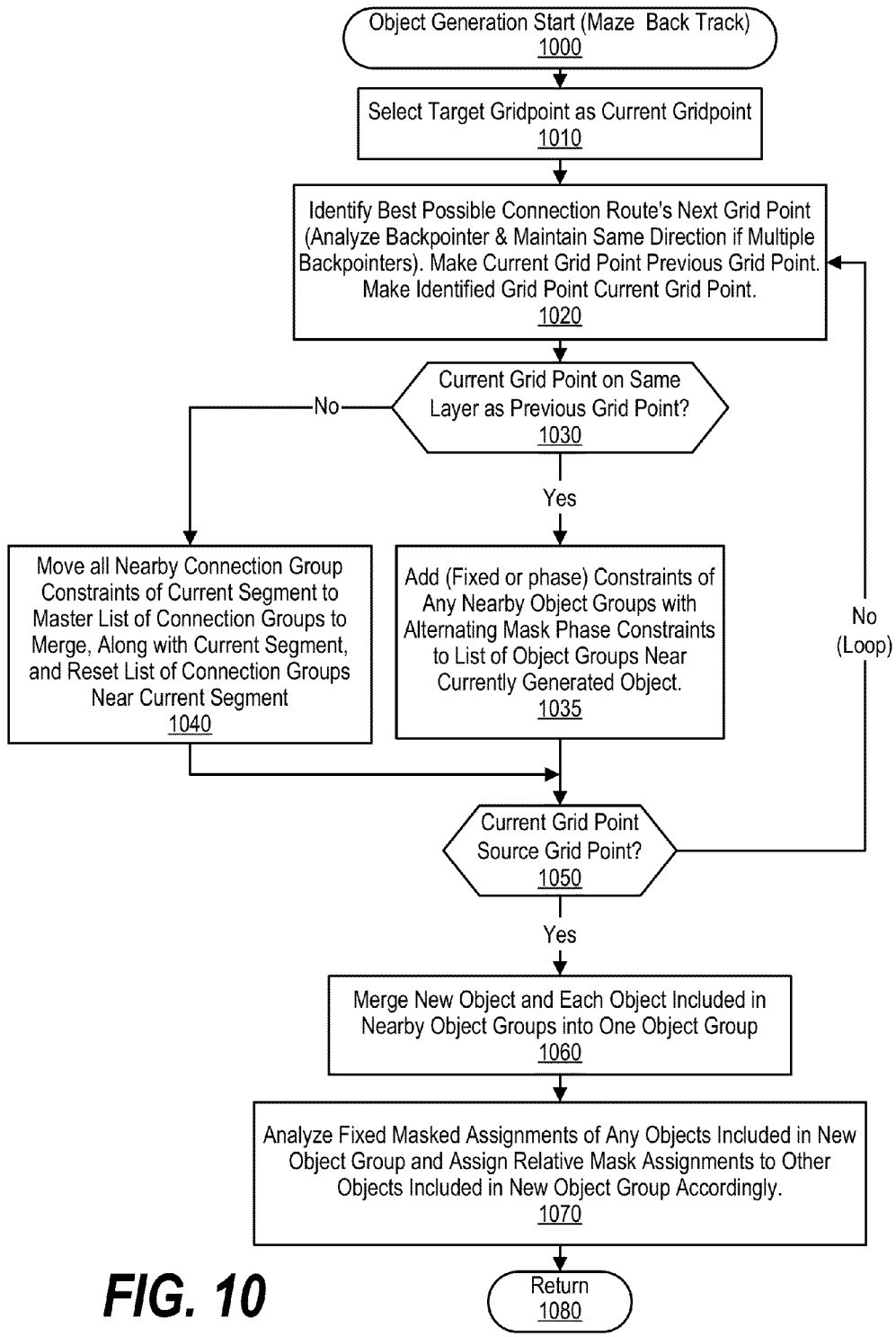
FIG. 10 is a flowchart showing steps taken in the enhanced routing module generating a connection object from a possible connection route.

FIG. 10 is a flowchart showing steps taken in the design layout tool generating a connection object from a possible connection route. Processing commences at 1000, whereupon the design layout tool selects a target grid point, which was just routed to in FIG. 10, as a current grid point (step 1010).

At step 1020, the design layout tool identifies a grid point adjacent to the target grid point that includes the "best" (e.g., lowest cost) expansion data corresponding to a particular possible connection route. In one embodiment, the design layout tool stores back track pointer information in each grid point as the design layout tool creates possible connection routes to assist in the back tracking process. Processing makes the current grid point (target grid point) the "previous grid point" and makes the identified grid point as the "current grid point" (e.g., traverse backwards).

A determination is made as to whether the current grid point is on the same layer as the previous grid point (decision 1030). If the current grid point is on the same layer, decision 1030 branches to the "Yes" branch, whereupon the design layout tool adds constraints of nearby object group objects with alternating mask assignment constraints to a list of object groups near the segment of the connection object being created (step 1035). In one embodiment, two lists may be stored during backtracking, one of which includes information pertaining to the segment of the connection object being generated. The other list may be a master list that includes information pertaining to the connection object as a whole, which is utilized as the back tracking processes re-visits a layer that was previously visited (to create a segment of the connection route). The two lists may be temporary and deleted after the new route is created and the nearby groups are merged.

On the other hand, if the current grid point is not on the same layer as the previous grid point, decision 1030 branches to the "No" branch, whereupon the design layout tool moves nearby object group constraints of the current segment to a master list of object groups to merge, along with the current segment, and resets the list of object groups near the current segment (step 1040). Referring to FIG. 7, as the design layout tool back tracks from target grid point 710, the design layout tool stores mask selection constraint vectors 780 in a master list as the design layout tool back tracks up to design layout layer 2 750 through via 765.

A determination is made as to whether the current grid point is the source grid point (decision 1050). If the current grid point is not the source grid point, decision 1050 branches to the "No" branch, which loops back to back track another grid point towards the source grid point. This looping continues until the design layout tool reaches the source grid point, at which point decision 1050 branches to the "Yes" branch.

At step 1060, the design layout tool merges the newly generated connection object with any objects included in nearby object groups into one object group (see FIG. 6 and corresponding text for further details). The design layout tool, at step 1070 analyzes objects having a fixed mask assignment (e.g., dedicated to mask 0) and assigns a relative mask assignment to the other objects included in the new object group accordingly. Referring to FIGS. 5 and 6, the design layout tool changes the mask assignment of objects 525, 530, and 535 due to the mask assignment of object 600. Processing returns at 1080.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program, in a non-transitory fashion, for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 11:
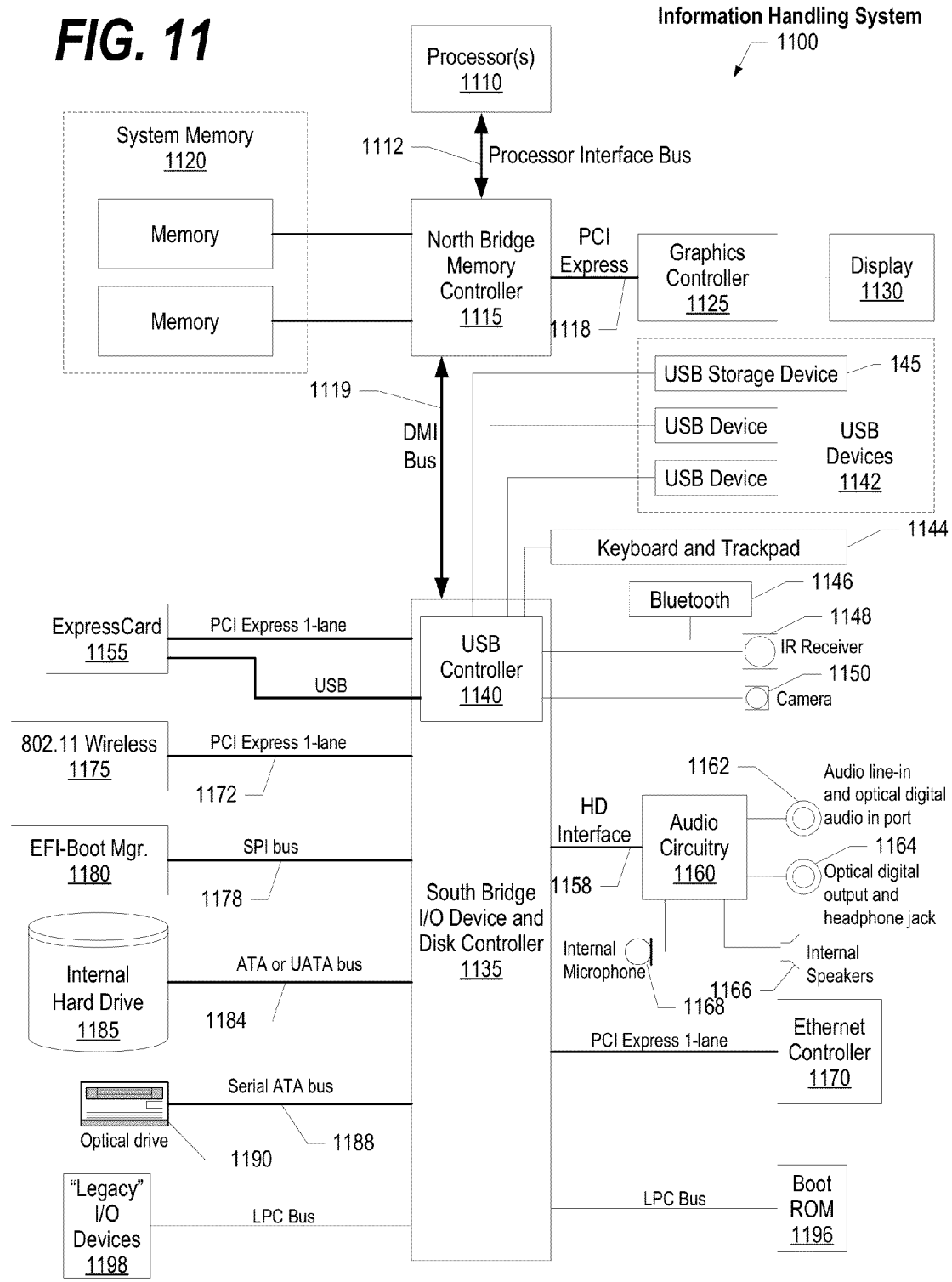
FIG. 11 is a block diagram of a data processing system in which the methods described herein can be implemented.

FIG. 11 illustrates information handling system 1100, which is a simplified example of a computer system capable of performing the computing operations described herein. Information handling system 1100 includes one or more processors 1110 coupled to processor interface bus 1112. Processor interface bus 1112 connects processors 1110 to Northbridge 1115, which is also known as the Memory Controller Hub (MCH). Northbridge 1115 connects to system memory 1120 and provides a means for processor(s) 1110 to access the system memory. Graphics controller 1125 also connects to Northbridge 1115. In one embodiment, PCI Express bus 1118 connects Northbridge 1115 to graphics controller 1125. Graphics controller 1125 connects to display device 1130, such as a computer monitor.

Northbridge 1115 and Southbridge 1135 connect to each other using bus 1119. In one embodiment, the bus is a Direct Media Interface (DMI) bus that transfers data at high speeds in each direction between Northbridge 1115 and Southbridge 1135. In another embodiment, a Peripheral Component Interconnect (PCI) bus connects the Northbridge and the Southbridge. Southbridge 1135, also known as the I/O Controller Hub (ICH) is a chip that generally implements capabilities that operate at slower speeds than the capabilities provided by the Northbridge. Southbridge 1135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 1196 and "legacy" I/O devices (using a "super I/O" chip). The "legacy" I/O devices (1198) can include, for example, serial and parallel ports, keyboard, mouse, and/or a floppy disk controller. The LPC bus also connects Southbridge 1135 to Trusted Platform Module (TPM) 1195. Other components often included in Southbridge 1135 include a Direct Memory Access (DMA) controller, a Programmable Interrupt Controller (PIC), and a storage device controller, which connects Southbridge 1135 to nonvolatile storage device 1185, such as a hard disk drive, using bus 1184.

ExpressCard 1155 is a slot that connects hot-pluggable devices to the information handling system. ExpressCard 1155 supports both PCI Express and USB connectivity as it connects to Southbridge 1135 using both the Universal Serial Bus (USB) the PCI Express bus. Southbridge 1135 includes USB Controller 1140 that provides USB connectivity to devices that connect to the USB. These devices include webcam (camera) 1150, infrared (IR) receiver 1148, keyboard and trackpad 1144, and Bluetooth device 1146, which provides for wireless personal area networks (PANs). USB Controller 1140 also provides USB connectivity to other miscellaneous USB connected devices 1142, such as a mouse, removable nonvolatile storage device 1145, modems, network cards, ISDN connectors, fax, printers, USB hubs, and many other types of USB connected devices. While removable nonvolatile storage device 1145 is shown as a USB-connected device, removable nonvolatile storage device 1145 could be connected using a different interface, such as a Firewire interface, etcetera.

Wireless Local Area Network (LAN) device 1175 connects to Southbridge 1135 via the PCI or PCI Express bus 1172. LAN device 1175 typically implements one of the IEEE 802.11 standards of over-the-air modulation techniques that all use the same protocol to wireless communicate between information handling system 1100 and another computer system or device. Optical storage device 1190 connects to Southbridge 1135 using Serial ATA (SATA) bus 1188. Serial ATA adapters and devices communicate over a high-speed serial link. The Serial ATA bus also connects Southbridge 1135 to other forms of storage devices, such as hard disk drives. Audio circuitry 1160, such as a sound card, connects to Southbridge 1135 via bus 1158. Audio circuitry 1160 also provides functionality such as audio line-in and optical digital audio in port 1162, optical digital output and headphone jack 1164, internal speakers 1166, and internal microphone 1168. Ethernet controller 1170 connects to Southbridge 1135 using a bus, such as the PCI or PCI Express bus. Ethernet controller 1170 connects information handling system 1100 to a computer network, such as a Local Area Network (LAN), the Internet, and other public and private computer networks.

While FIG. 11 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:
   retrieving, from a storage area by one or more processors, a design layout that includes a plurality of grid points corresponding to a plurality of masks utilized to generate one physical layer on a semiconductor wafer; and
   creating, by one or more of the processors, a connection object on the design layout by identifying a series of grid points from the plurality of grid points, wherein identification of each of the grid points included in the series of grid points ensures that the connection object is constrained to be assigned to one of the plurality of masks.

2. The method of claim 1 wherein the series of grid points comprises a possible connection route, the method further comprising:
   selecting a first grid point assigned to the possible connection route and a second grid point not assigned to the possible connection route, the first grid point and the second grid point included in the plurality of grid points; and
   assigning the second grid point to the possible connection route in response to determining that combining one or more first mask selection constraints corresponding to the first grid point with one or more second mask selection constraints corresponding to the second grid point allows an assignment of at least one of the plurality of masks to be permitted to the possible connection route.

3. The method of claim 2 further comprising:
   determining whether one or more first object group identifiers included in the one or more first mask selection constraints matches one or more second object group identifiers included in the one or more second mask selection constraints, the one or more first object group identifiers corresponding to a first set of objects and the one or more second object group identifiers corresponding to a second set of objects; and
   permitting the assignment to the possible connection route of at least one of the plurality of masks in response to determining that the one or more first object group identifiers fails to match the one or more second object group identifiers.

4. The method of claim 3 wherein, in response to determining that at least one of the one or more first object group identifiers matches at least one of the one or more second object group identifier, the method further comprises:
   determining whether a first mask assignment identifier corresponding to the matched first object group identifier matches a second mask assignment identifier corresponding to the matched second object group identifier, wherein the first mask assignment identifier identifies one of the plurality of masks and the second mask assignment identifier identifies one of the plurality of masks; and
   permitting the assignment to the possible connection route of at least one of the plurality of masks in response to determining that the first mask assignment identifier matches the second mask assignment identifier.

5. The method of claim 4 further comprising:
   avoiding the second grid point during generation of the possible connection route in response to determining that the first mask assignment identifier fails to match the second mask assignment identifier.

6. The method of claim 2 further comprising:
   creating a plurality of possible connection routes between a source grid point and a target grid point, the possible connection route included in the plurality of possible connection routes;
   generating a connection cost of each of the plurality of possible connection routes, resulting in a plurality of connection costs, wherein the connection cost of the possible connection route corresponds to a distance between the source grid point and the target grid point and is based upon at least the one or more first mask selection constraints;
   determining that the possible connection route has a lowest connection cost out of the plurality of connection costs; and
   back tracking the possible connection route from the target grid point to the source grid point in response to determining that the possible connection route has the lowest connection cost out of the plurality of connection costs, wherein the connection route is created in response to the back tracking of the possible connection route.

7. The method of claim 6 wherein the connection object corresponds to a first object group and a second object group, wherein the first object group includes a plurality of first objects and the second object group includes a plurality of second objects, the method further comprising:
  combining the plurality first objects, the plurality of second objects, and the connection object into a single object group in response to the back tracking of the possible connection route.

8. The method of claim 7 further comprising:
  changing a mask assignment identifier of each of the plurality of second objects in response to combining the plurality first objects, the plurality of second objects, and the connection object into the single object group.

9. The method of claim 2 wherein the one or more first mask selection constraints and the one or more second mask selection constraints are included in a set of constraint vectors, the method further comprising:
  selecting a third grid point not assigned to the possible connection route;
  determining that the third grid point is located on a different plurality of grid points corresponding to a different mask utilized to generate a different physical layer on the semiconductor wafer;
  storing the first mask selection constraints and the second mask selection constraints in a storage area;
  resetting the set of constraint vectors, wherein the resetting removes the first mask selection constraints and the second mask selection constraints;
  including one or more third mask selection constraints corresponding to the third grid point in the reset set of constraint vectors; and
  assigning the third grid point to the possible connection route.

10. The method of claim 9 further comprising:
  selecting a fourth grid point not assigned to the connection route;
  determining that the fourth grid point is located on the plurality of grid points;
  retrieving the one or more first mask selection constraints and the one or more second mask selection constraints from the storage area in response to determining that the fourth grid point is located on the plurality of grid points;
  comparing one or more fourth mask selection constraints corresponding to the fourth grid point to the retrieved one or more first mask selection constraints and the retrieved one or more second mask selection constraints; and
  assigning the fourth grid point to the connection route based upon a comparison result of the comparing.

11. The method of claim 1 wherein the design layout is devoid of a semiconductor manufacturing stitching requirement to connect one or more first physical objects generated from a first one of the plurality of masks with one or more second physical objects generated from a second one of the plurality of masks.

12. An information handling system comprising:
  one or more processors;
  one or more memories accessible by at least one of the processors;
  a design layout tool, executable by the one or more processors, that retrieves, from one of the one or more memories, a design layout that includes a plurality of grid points corresponding to a plurality of masks utilized to generate one physical layer on a semiconductor wafer; and
  an enhanced routing module included in the design layout tool that creates a connection object on the design layout by identifying a series of grid points from the plurality of grid points, wherein identification of each of the grid points included in the series of grid points ensures that the connection object is constrained to be assigned to one of the plurality of masks.

13. The information handling system of claim 12 wherein the series of grid points comprise a possible connection route, the information handling system further comprising:
  selection logic included in the enhanced routing module that selects a first grid point assigned to the possible connection route and a second grid point not assigned to the possible connection route, the first grid point and the second grid point included in the plurality of grid points; and
  assignment logic included in the enhanced routing module that assigns the second grid point to the possible connection route in response to determining that combining one or more first mask selection constraints corresponding to the first grid point with one or more second mask selection constraints corresponding to the second grid point allows an assignment of at least one of the plurality of masks to be permitted to the possible connection route.

14. The information handling system of claim 13 further comprising:
  determination logic included in the enhanced routing module that determines whether one or more first object group identifiers included in the one or more first mask selection constraints matches one or more second object group identifiers included in the one or more second mask selection constraints, the one or more first object group identifiers corresponding to a first set of objects and the one or more second object group identifiers corresponding to a second set of objects;
  analysis logic included in the enhanced routing module that permits the assignment to the possible connection route of at least one of the plurality of masks in response to the determination logic determining that the one or more first object group identifiers fails to match the one or more second object group identifiers; and
  the analysis logic that, in response to the determination logic determining that at least one of the one or more first object group identifiers matches at least one of the one or more second object group identifier:
    determines whether a first mask assignment identifier corresponding to the matched first object group identifier matches a second mask assignment identifier corresponding to the matched second object group identifier,
    wherein the first mask assignment identifier identifies one of the plurality of masks and the second mask assignment identifier identifies one of the plurality of masks; and
    permits the assignment to the possible connection route of at least one of the plurality of masks in response to determining that the first mask assignment identifier matches the second mask assignment identifier.

15. The information handling system of claim 14 further comprising:
  the enhanced routing module that avoids the second grid point during generation of the possible connection route in response to determining that the first mask assignment identifier fails to match the second mask assignment identifier.

16. A computer program product stored in a computer readable storage device, comprising computer program code that, when executed by an information handling system, causes the information handling system to perform actions comprising:
    retrieving a design layout that includes a plurality of grid points corresponding to a plurality of masks utilized to generate one physical layer on a semiconductor wafer; and
    creating a connection object on the design layout by identifying a series of grid points from the plurality of grid points, wherein identification of each of the grid points included in the series of grid points ensures that the connection object is constrained to be assigned to one of the plurality of masks.

17. The computer program product of claim 16 wherein the series of grid points comprise a possible connection route, and wherein the computer readable storage device stores additional instructions that, when executed by the information handling system, cause the information handling system to perform additional actions comprising:
    selecting a first grid point assigned to the possible connection route and a second grid point not assigned to the possible connection route, the first grid point and the second grid point included in the plurality of grid points; and
    assigning the second grid point to the possible connection route in response to determining that combining one or more first mask selection constraints corresponding to the first grid point with one or more second mask selection constraints corresponding to the second grid point allows an assignment of at least one of the plurality of masks to be permitted to the possible connection route.

18. The computer program product of claim 17 wherein the computer readable storage device stores additional instructions that, when executed by the information handling system, cause the information handling system to perform additional actions comprising:
    determining whether one or more first object group identifiers included in the one or more first mask selection constraints matches one or more second object group identifiers included in the one or more second mask selection constraints, the one or more first object group identifiers corresponding to a first set of objects and the one or more second object group identifiers corresponding to a second set of objects;
    permitting the assignment to the possible connection route of at least one of the plurality of masks in response to determining that the one or more first object group identifiers fails to match the one or more second object group identifiers; and
    in response to determining that at least one of the one or more first object group identifiers matches at least one of the one or more second object group identifier:
        determining whether a first mask assignment identifier corresponding to the matched first object group identifier matches a second mask assignment identifier corresponding to the matched second object group identifier, wherein the first mask assignment identifier identifies one of the plurality of masks and the second mask assignment identifier identifies one of the plurality of masks; and
        permitting the assignment to the possible connection route of at least one of the plurality of masks in response to determining that the first mask assignment identifier matches the second mask assignment identifier.

19. The computer program product of claim 18 wherein the computer readable storage device stores additional instructions that, when executed by the information handling system, cause the information handling system to perform additional actions comprising:
    avoiding the second grid point during generation of the possible connection route in response to determining that the first mask assignment identifier fails to match the second mask assignment identifier.

20. The computer program product of claim 16 wherein the connection object corresponds to a first object group and a second object group, wherein the first object group includes a plurality of first objects and the second object group includes a plurality of second objects, and wherein the computer readable storage device stores additional instructions that, when executed by the information handling system, cause the information handling system to perform additional actions comprising:
    combining the plurality first objects, the plurality of second objects, and the connection object into a single object group in response to back tracking the possible connection route; and
    changing a mask assignment identifier of each of the plurality of second objects in response to combining the plurality first objects, the plurality of second objects, and the connection object into the single object group.

\* \* \* \* \*